(12) United States Patent
Kato et al.

(10) Patent No.: US 7,192,201 B2
(45) Date of Patent: Mar. 20, 2007

(54) OPTICAL TRANSMITTING MODULE HAVING A DE-COUPLING INDUCTOR THEREIN

(75) Inventors: Kiyoshi Kato, Yokohama (JP); Hisao Go, Yokohama (JP); Eiji Tsumura, Yokohama (JP); Akihiro Moto, Yokohama (JP); Toshiaki Kihara, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 287 days.

(21) Appl. No.: 10/900,397

(22) Filed: Jul. 28, 2004

(65) Prior Publication Data

US 2005/0047732 A1    Mar. 3, 2005

Related U.S. Application Data

(63) Continuation-in-part of application No. 10/887,328, filed on Jul. 9, 2004.

(30) Foreign Application Priority Data

Jul. 9, 2003   (JP) .............................. 2003-272563
Jul. 28, 2003  (JP) .............................. 2003-281287

(51) Int. Cl.
   *G02B 6/36*   (2006.01)
   *H01S 5/00*   (2006.01)
(52) U.S. Cl. ............................. 385/92; 385/14; 385/88; 385/24; 385/49; 372/38.1; 372/38.02; 372/38.07; 372/43.01; 372/46.01; 372/50.1
(58) Field of Classification Search ................. 385/88, 385/89, 14, 92, 93, 94, 24, 49; 372/38.1, 372/38.02, 38.07, 43.01, 46.01, 50.1
See application file for complete search history.

(56) References Cited

U.S. PATENT DOCUMENTS

| | | | |
|---|---|---|---|
| 5,212,699 A | 5/1993 | Masuko et al. | 372/74 |
| 5,706,303 A * | 1/1998 | Lawrence | 372/38.02 |
| 6,618,408 B1 | 9/2003 | Mader et al. | 372/38.02 |
| 6,920,161 B2 * | 7/2005 | Riaziat et al. | 372/36 |
| 7,052,189 B2 * | 5/2006 | Naka et al. | 385/92 |
| 2002/0167977 A1 | 11/2002 | Nakabayashi et al. | 372/36 |
| 2004/0037334 A1 | 2/2004 | Funada et al. | 372/43 |
| 2005/0105911 A1 * | 5/2005 | Keh et al. | 398/138 |
| 2005/0242749 A1 * | 11/2005 | Roach | 315/224 |

FOREIGN PATENT DOCUMENTS

| | | | | |
|---|---|---|---|---|
| JP | 7-240565 | 9/1995 | | 385/92 X |
| JP | 2000-28872 | 1/2000 | | 382/92 X |
| JP | 2000-353846 | 12/2000 | | 385/92 X |
| JP | 2002-374028 | 12/2002 | | 385/92 X |
| JP | 2003-37329 | 2/2003 | | 385/92 X |
| JP | 2003-229629 | 8/2003 | | 385/92 X |
| JP | 2003-332667 | 11/2003 | | 385/92 X |

* cited by examiner

*Primary Examiner*—Brian M. Healy
(74) *Attorney, Agent, or Firm*—McDermott Will & Emery LLP (57) ABSTRACT

The present invention provides an optical transmitting module or optical transmitting sub-assembly in which an inductor for de-coupling the bias circuit of the semiconductor laser diode is built. The laser diode is mounted on the side surface of the block provided on the stem, while the inductor is installed on the lead, which is secured by the stem, such that one electrode of the inductor is in contact to the lead and the other electrode of the inductor is connected to an electrode of the laser diode. The electrode of the laser diode is also connected to the other lead. Thus, the electrode of the laser diode is connected to two leads, one of which is through the inductor.

15 Claims, 14 Drawing Sheets

OPTICAL TRANSMITTING MODULE HAVING A DE-COUPLING INDUCTOR THEREIN

CROSS REFERENCE TO RELATED APPLICATIONS

This application is a continuation-in-part of and claims priority to U.S. patent application Ser. No. 10/887,328, filed on Jul. 9, 2004, pending, entitled "Optical transmitting module" by Go, Hisao et al., which claims the benefit of Japanese Patent Application No. JP 2003-272653, filed on Jun. 9, 2003, In addition priority is claimed from Japanese Patent Application No. JP 2003-281287, filed on Jul. 28, 2003, the entire disclosure of which is incorporated by reference, herein.

BACKGROUND OF THE INVENTION

1. Field of the Invention

The present invention relates to an optical transmitting module, particularly relates to an optical transmitting module having a CAN type package.

2. Related Prior Art

Recently, it is requested that a terminator should be installed within an optical transmitting module or an optical transmitting sub-assembly to match an input impedance thereof to the line impedance as the transmission speed in the optical communication system which increases and reaches to giga-hertz (GHz) band. Moreover, it is generally applied for an optical active device, such as a semiconductor laser diode and a pre-amplifier, to dissipate larger power in order to operate in such high-speed signal. In order to keep quality of the output signal light, it should be required not to leak the high-speed signal into the bias circuit of the laser diode.

In the optical transmitting module or the optical transmitting sub-assembly having a CAN type package, the miniaturization of the package may be easily carried out. On the other hand, to install the terminator or other electronic devices within the CAN type package is so hard because of its small sized package. One exemplary configuration is known that a block is formed on a stem of the CAN type package, and the laser diode is mounted on the block via a substrate made of aluminum nitride (AlN), which operates as a heat sink. In addition to the laser diode disposed on the heat sink, a thin film metal resistor is also formed on the AlN substrate, and electrical connection from the resistor to the lead of the package and the semiconductor are carried out by micro-strip lines.

According to such configuration of the optical transmitting module with the CAN type package, since the termination resistor can be provided within the package as a thin film resistor, the module may operate and emit light in GHz band with quality. However, it would be quite impossible to further install an inductor for de-coupling the bias circuit of the laser diode into the CAN type-package that installs the micro-strip line.

Japanese patent published as 11-243254 has disclosed that, by inserting the inductor to the bias circuit to the laser diode for de-coupling thereof, the high-frequency performance of the optical transmitting module can be enhanced. However, it would be unknown, at least within knowledge of inventors, that the de-coupling inductor that is generally bulky is built in the CAN type package without expanding the size thereof.

Therefore, one object of the present invention is to provide an arrangement of the optical transmitting module that installs the laser diode and the de-coupling inductor therein, and shows a superior high frequency performance.

SUMMARY OF THE INVENTION

According to a first aspect of the present invention, an optical transmitting module is provided. The optical transmitting module of the present invention includes a semiconductor laser diode, an inductor and a CAN type package having a base, a block provided on the base and a first lead secured to the base. The inductor is fixed to the first lead such that a second terminal thereof faces and is in contact to the first lead, while a first terminal is connected to the laser diode for supplying a bias current to the laser diode. The inductor may be mounted on a top surface of the first lead, or the first lead may have a flat side surface on a top portion thereof for mounting the inductor thereon.

The base may further include a second lead connected to the laser diode for supplying a driving signal thereto. The second lead may have a flat side surface on a top portion thereof, and the laser diode may be connected to the second lead through a resistor further provided in the optical transmitting module and mounted on the flat side surface of the second lead.

The laser diode may be mounted on the side surface of the block through a heat sink. In the case that the heat sink is made of insulating material, the heat sink may gave a metallic pattern provided on a surface thereof and the first terminal of the inductor may be connected to the laser diode via the metallic pattern.

The inductor may further include a slab member made of conductive material on the first terminal thereof The laser diode may be connected to the top surface opposite to a surface facing and being in contact to the first terminal of the inductor or the side surface of the slab member. The slab member may be a disk-shaped member.

According to a second aspect of the present invention, a transmitting optical sub-assembly (TOSA) is provided. The TOSA includes an optical transmitting module of the first aspect described above, a welding member, an alignment member and a sleeve assembly. The welding member cylindrically surrounds the CAN type package of the optical transmitting module, and the alignment member with a bore covers the welding member and the CAN type package in the bore. By sliding the welding member in the bore, an optical alignment along the optical axis can be carried out.

The sleeve assembly includes a stub, a sleeve, a sleeve cover and a bush. The stub has a coupling fiber in a center thereof, the light emitted from the laser diode provided in the optical transmitting module is converged to the coupling fiber. The sleeve secures the stub in an end portion thereof. The sleeve cover covers the sleeve. The bush is press-fitted between the sleeve cover and the end portion of the sleeve such that the stub is tightly positioned within the sleeve. The sleeve assembly can be optically aligned in a plane perpendicular to the optical axis with respect to the alignment member by sliding the sleeve assembly on an end surface of the alignment member. Thus, the optical alignment between the laser diode and the sleeve assembly along three directions can be carried out.

The foregoing, together with other features and advantages of the present invention, will become more apparent when referring to the following specification, claims, and accompanying drawings.

DETAILED DESCRIPTION OF PREFERRED EMBODIMENTS

Next, preferred embodiments of the invention will be described in detail as referring to accompanying drawings. In specifications below and drawings, same elements will be referred by same numerals or same symbols without over lapping explanations.

(First Embodiment)

Figure 1:
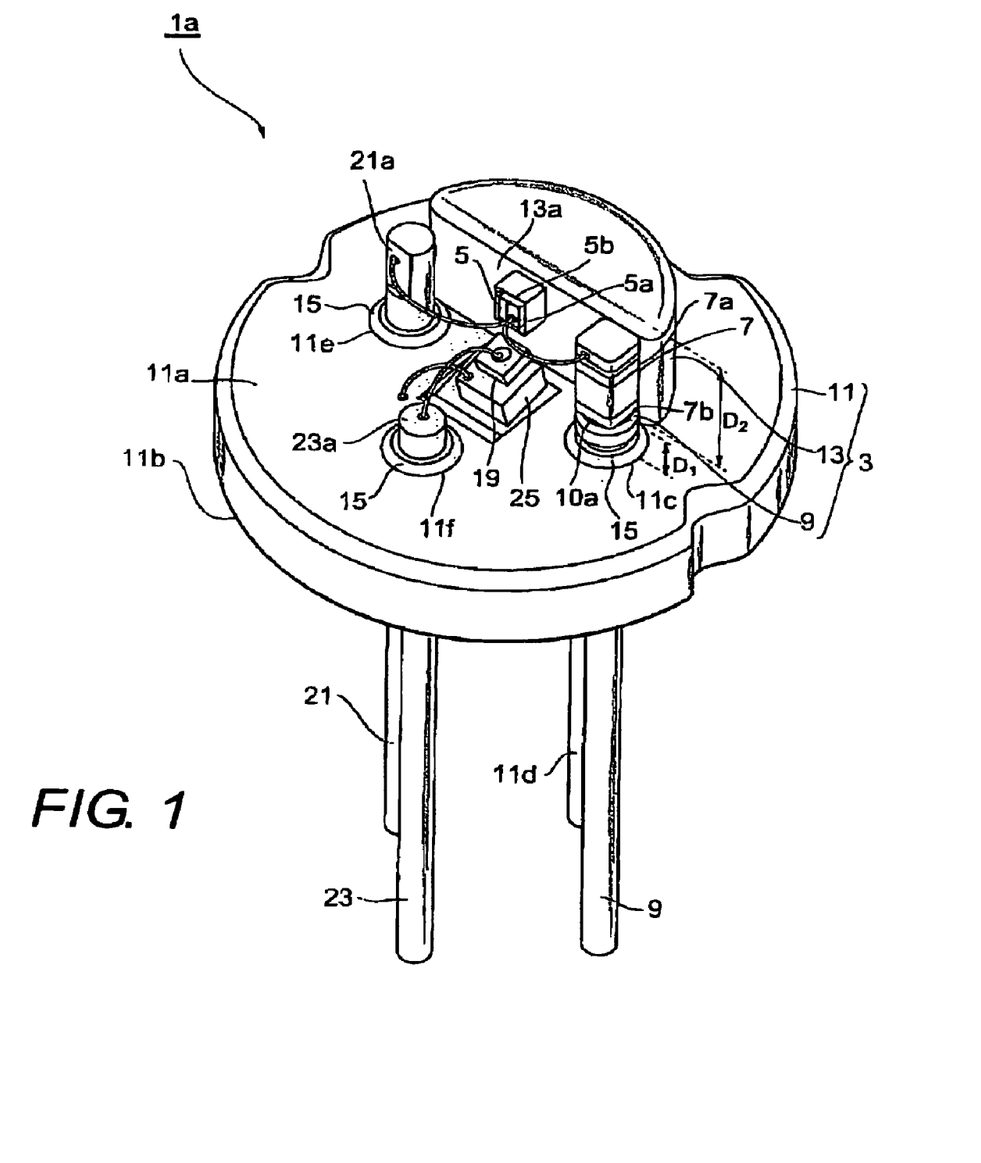
FIG. 1 is a perspective view showing the optical transmitting module according to the first embodiment of the present invention.
Figure 2:
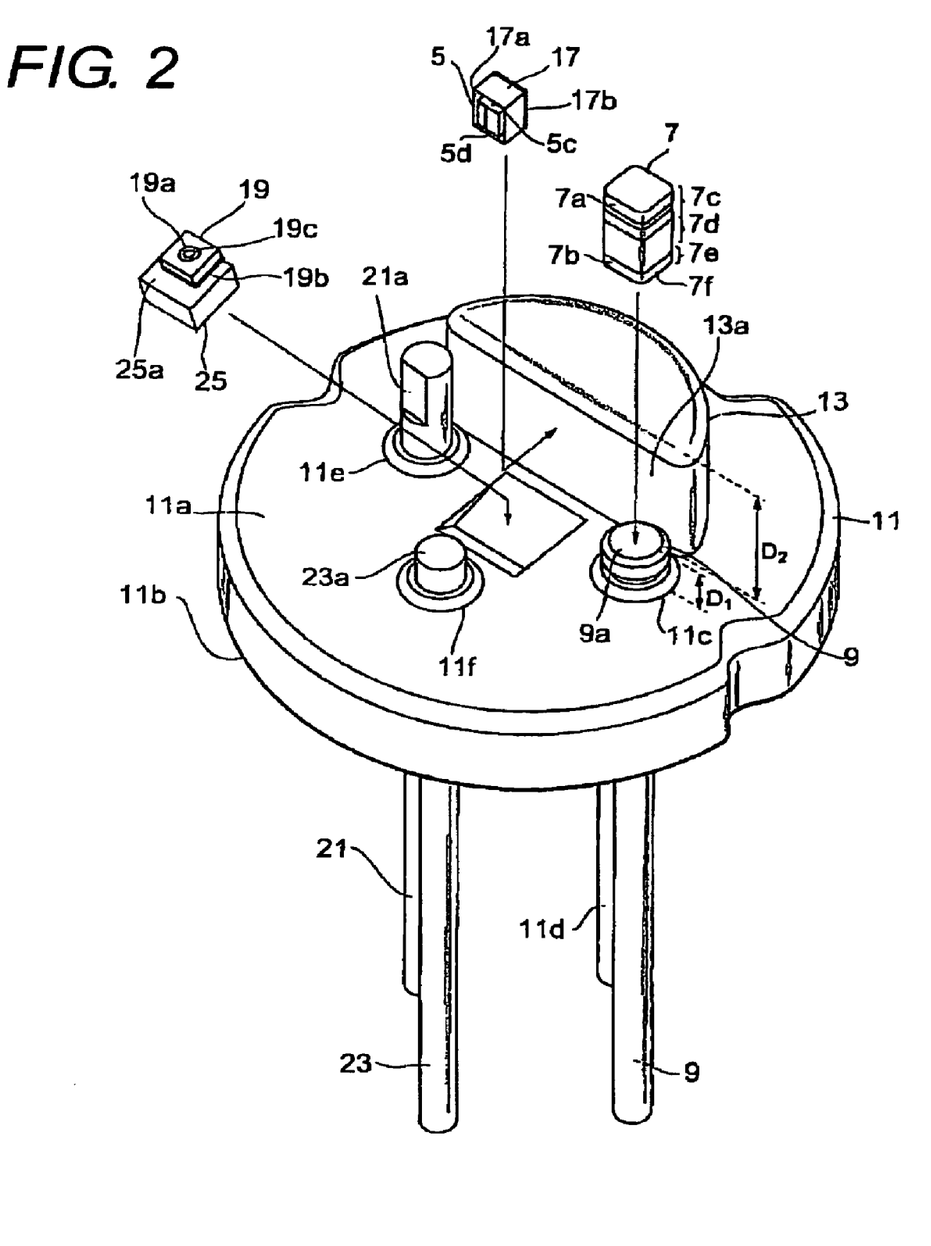
FIG. 2 is an exploded view of the optical transmitting module according to the first embodiment.

FIG. 1 shows an optical transmitting module and FIG. 2 is an exploded view of an optical transmitting module according to the present invention.

The optical transmitting module 1a includes a stem 3, a semiconductor laser diode 5, and an inductor 7. The stem 3 provides a base 11, leads 9 and 25, and a block 13 whose side surface 13a mounts the laser diode 5 thereon through a heat sink 17. The inductor 7, which is fixed to the lead 9, has first and second terminals, 7a and 7b, respectively. The first terminal 7a is connected to the first electrode 5a of the laser diode, while the second terminal 7b thereof is connected to the lead 9. The lead 9 has a flat portion 9a in a top thereof. The bias current for the laser diode 5 is applied through the lead 9 and the inductor 7.

In the optical transmitting module 1a shown in FIG. 1, the inductor 7 is installed on the base 11 in addition to the laser diode 5 without providing a supplemental region on the side surface 13a of the block 13, because the inductor 7 is fixed and mounted on the top of lead 9.

In order to attain compactness of the optical transmitting module 1a, a length $D_1$ of the lead 9 protruding from the base 11, which is equivalent to a level of the top surface 9a of the lead 9, is smaller than a height $D_2$ of the block 13. This configuration of the lead 9 and the block 13 enables that, since the inductor 7 is fixed on the lead 9 such that the second terminal 7b thereof faces and is in contact to the lead 9 with conductive resin 10a, the first terminal 7a of the inductor 7 can be wire-bonded to the laser diode 5 without any difficulty.

The inductor 7 may be a chip inductor, specifically a multi-layered chip inductor such as, what is called a ferrite bead inductor, or a wire-wound inductor. The inductance of the inductor 7 is preferably at least 1 micro-henry (uH) to suppress a change of the bias current supplied to the laser diode.

The base 11 and the block 13 are made of metal such as Kovar. The base 11 includes a hole 11c, through which the leads 9 passes. Within the hole 11c is filled with seal glass 15. Thus, the base 11 supports the lead 9 through the seal glass 15. Moreover, the base 11 directly, without any seal glass, secures the lead 11d, Therefore, the base 11 and the block 15 are electrically connected to the lead 11d.

The laser diode 5, having a front facet 5c and a rear facet 5d, is mounted on the side surface 13a of the block 13 via the heat sink 17. The heat sink 17, made of insulating material with good thermal conductivity such as aluminum nitride (1N), provides metallic pattern 17a and 17b, for example made of AuSn eutectic alloy, on both surfaces thereof for the brazing. That is, the metallic pattern 17a on the primary surface of the heat sink 17 is provided for the die-bonding of the laser diode 5 and for the wire-bonding thereto, while the metallic pattern provided on the other surface is for the chip mounting of the heat sink 17 onto the block 13. The heat sink 17 is not restricted to an insulating material. An electrically conductive material, such as copper tungsten (CuW) sintered metal, may be applicable for the heat sink 17. When the electrically conductive heat sink 17 is used, the second electrode 5b of the laser diode 5 is directly connected to the block 13, namely, to the base 11. On the other hand, the heat sink is insulating, the electrode 5b of the laser diode is connected to the base 11, for example, by connecting metallic patterns 17a and 17b provided on both surfaces of the heat sink 17 by via holes filled with metal or by wire-bonding the metallic pattern 17a on the surface of the heat sink 17 to the base 11.

The base 11 also secures another lead 21, the first electrode 5a of the laser diode 5 is wire-bonded to the side surface 21a thereof, thus the laser diode is supplied a driving signal from the lead 21. Although in FIG. 1 and FIG. 2, a tip of the lead 25 provides a flat portion, the wire-bonding way be performed to a curved surface of the lead 25.

The present optical module 1a may further include a semiconductor light-receiving device 19, such as photo-diode, on the base 11 for monitoring optical output power of the laser diode 5. The photodiode 19 generates photo current corresponding to the optical output power of the laser diode 5 received by an optical sensitive surface 19a thereof. One electrode 19a of the photodiode 19 is connected to a top surface 23a of the lead 23 to output the photo current therefrom.

The photodiode 19 is mounted on a sub-mount 25, which provides a wiring pattern, and is placed on the base 11. The electrode 19a of the photodiode 19 is connected to a top surface 23a of the lead 23, while the other electrode 19b thereof is directly connected to the base 11 via the wiring pattern 25a provided on the sub-mount 25 and a bonding-wire.

The laser diode 5 is mounted on an upper portion 13c of the block 13 to make an enough space for the photodiode 19 being mounted beneath the laser diode 5 to receive light emitted from the rear facet 5d thereof In the optical transmitting module of the present invention, the laser diode 5, the Leads 9 and 21 are substantially arranged on an imaginary plane such that two leads 9 and 21 sandwich the laser diode 5. Moreover, the photodiode 19 is placed beneath the laser diode 5. Therefore, the bonding-wire connecting the first terminal 7a of the inductor 7 to the laser diode 5 does not interfere with the other bonding-wire connecting the laser diode 5 to the lead 21.

Similar relations may be applied to the bonding-wire connecting the photodiode 19 to the lead 23 and that connecting the laser diode 5 to the inductor 7 or to the lead 21. This arrangement may facilitate the wire-bonding process between devices and elements.

Figure 3:
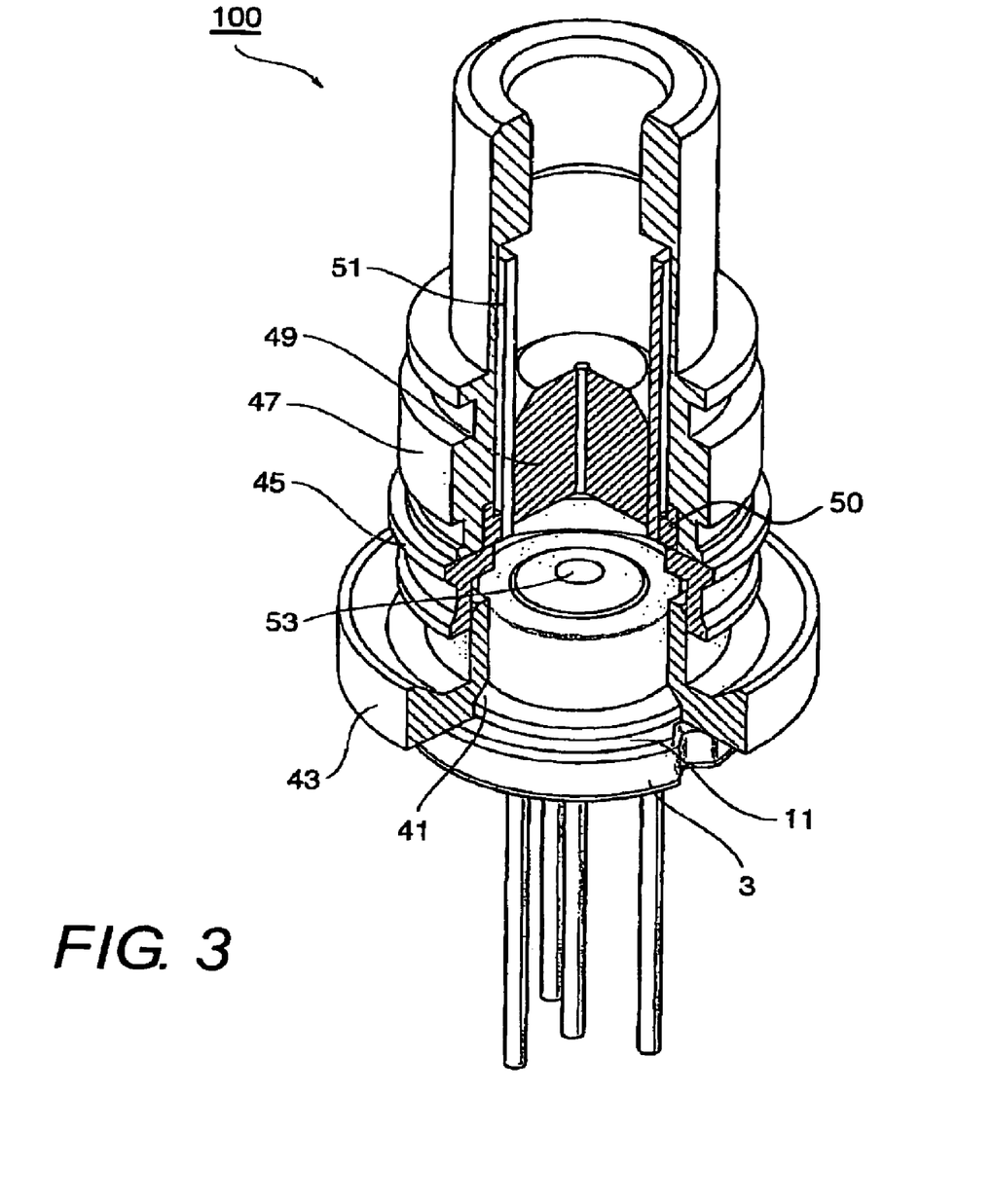
FIG. 3 is a cutaway perspective view showing a transmitting optical sub-assembly of the present invention.

FIG. 3 shows a transmitting optical sub-assembly (TOSA) 100 including the optical transmitting module 1a of the present invention. The TOSA 100 includes a cap 41 for enclosing optical and electrical devices 5 and 7 therein cooperating with the stem 3, a welding member 43, an alignment member 45, and a sleeve assembly. The sleeve assembly includes a sleeve cover 47, a stub 49, a bush 50, and a split sleeve 51. The cap 41 may provide a lens 53 on a top center thereof for converging light emitted from the laser diode 5 to a coupling fiber provided in a center of the stub 49. The welding member 43 is provided for the YAG-laser welding to the alignment member 45. That is, after optical alignment between the alignment member 45 and the welding member 43 along the optical axis by sliding the alignment member 45 on the outer surface of the welding member 43, the YAG-laser welding is carried out for permanently fixing these two members. The split sleeve 51 secures the stub 49 in one end thereof, and a metallic bush 50 is press-fitted between the split sleeve 51 and the sleeve cover 47. Thus, the stub 49 is secured in the end of the split sleeve 51. Thus configured sleeve assembly is optically aligned to the laser diode 5 by sliding the sleeve assembly on the end surface of the alignment member 45, which aligns to each other in a plane perpendicular the optical axis.

(Second Embodiment)

Figure 4:
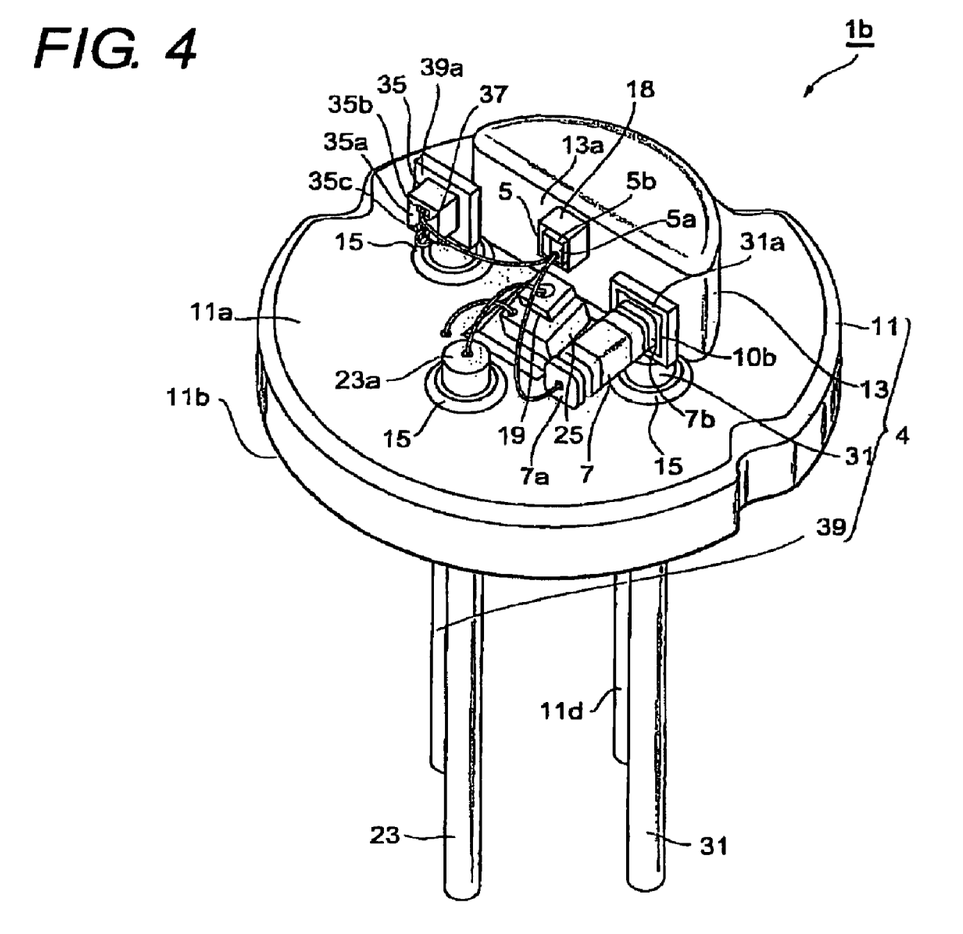
FIG. 4 is a perspective view showing of the optical transmitting module according to the second embodiment of the invention.

FIG. 4 shows an optical transmitting module 1b according to the second embodiment of the invention. In the optical module 1b, the inductor 7 is mounted on a flat side surface of the lead 31, i.e., the top portion of the lead 31 is formed flat where the inductor 7 is mounted such that the second terminal 7b thereof faces and is fixed thereto. The other terminal 7a of the inductor 7 is connected to the laser diode 5 with the bonding-wire. The flat portion 31a of the lead 31 may be formed by the stamping or the cutting.

The optical module 1b further includes an electronic device 35 on a flat side surface 39a of the lead 39. The electronic device 35 may include a resistor 37 and has first and second terminals 35b and 35c on a primary surface 35a thereof. The driving signal for driving the laser diode 5 is applied through the lead 39 and the resistor 37. Thus, the resistor 37 may compensate the impedance mismatching between the transmission line connected to the lead 39, and the input impedance of the optical module 1b. The resistance of the resistor 37 is preferably between 5 ohm to 50 ohm.

The first terminal 35b of the electronic device 35 is connected to the first electrode 5a of the laser diode 5, while the second terminal 35c thereof is connected to the lead 39, for example the flat surface 39a thereof.

Also in the present embodiment, the leads 31 and 39, and the laser diode 5 are substantially arranged in a unique imaginary plane. The bonding-wire connecting the electronic device 35 to the laser diode 5 and that connecting the laser diode 5 to the inductor 7 are extending to the opposite direction, thereby not interfering each other. Moreover, bonding wires to connecting the resistor 37 to the lead 39, that connecting the photodiode 23 to the lead 15, and that connecting the photodiode 23 to the base 11 do not interfere with respect not only to each other but also to bonding-wires connecting the laser diode 5 to the resistor 37 and to the inductor 7.

Figure 5A:
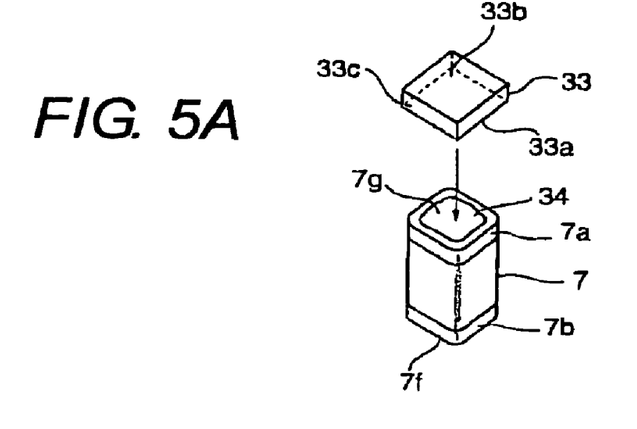
FIG. 5A shows an inductor and a rectangle slab member.
Figure 5B:
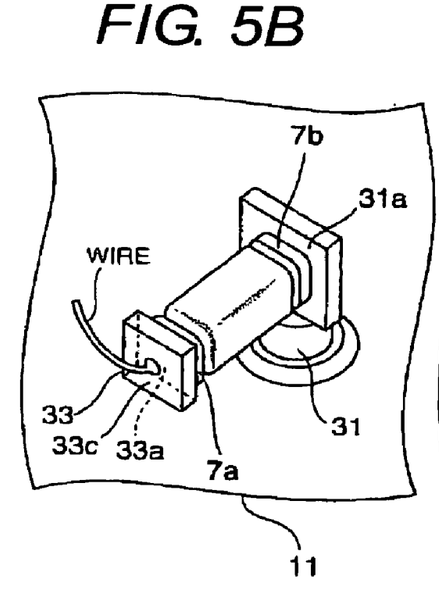
FIG. 5B shows an assembled inductor and the slab member fixed to the side surface of the lead.
Figure 5C:
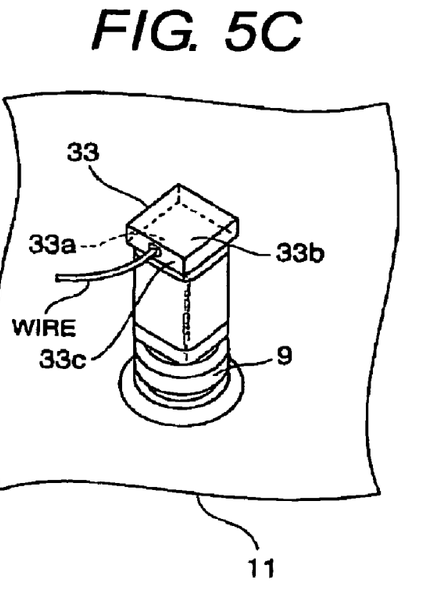
FIG. 5C shows an assembled inductor and the slab member fixed to the top surface of the lead.
Figure 6A:
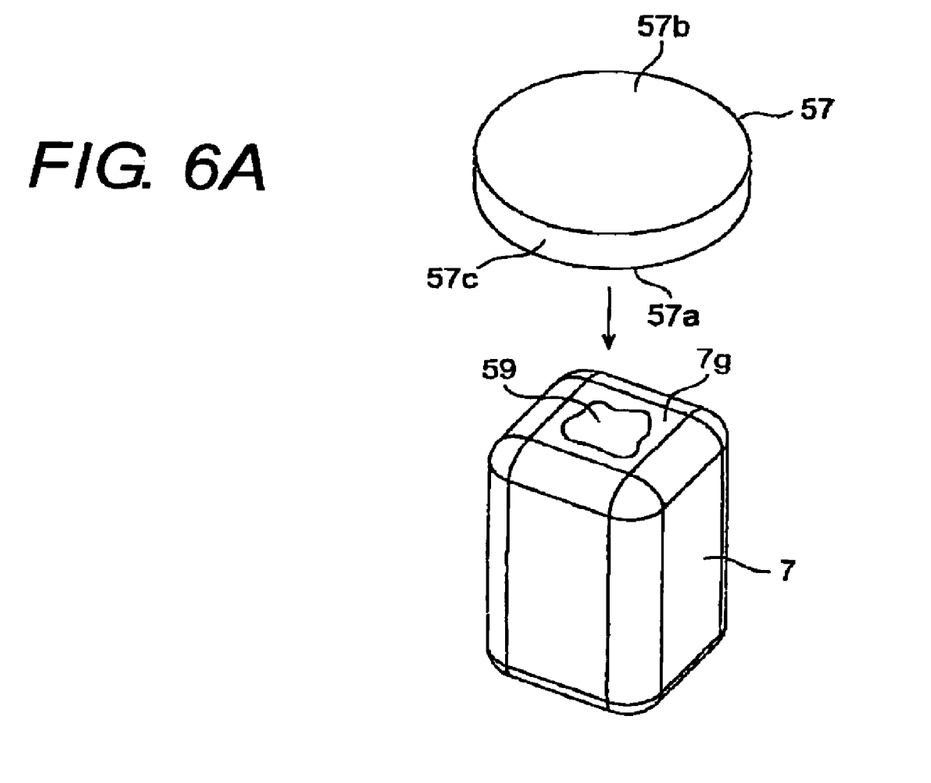
FIG. 6A shows an inductor and a disk-shaped slab member.
Figure 6B:
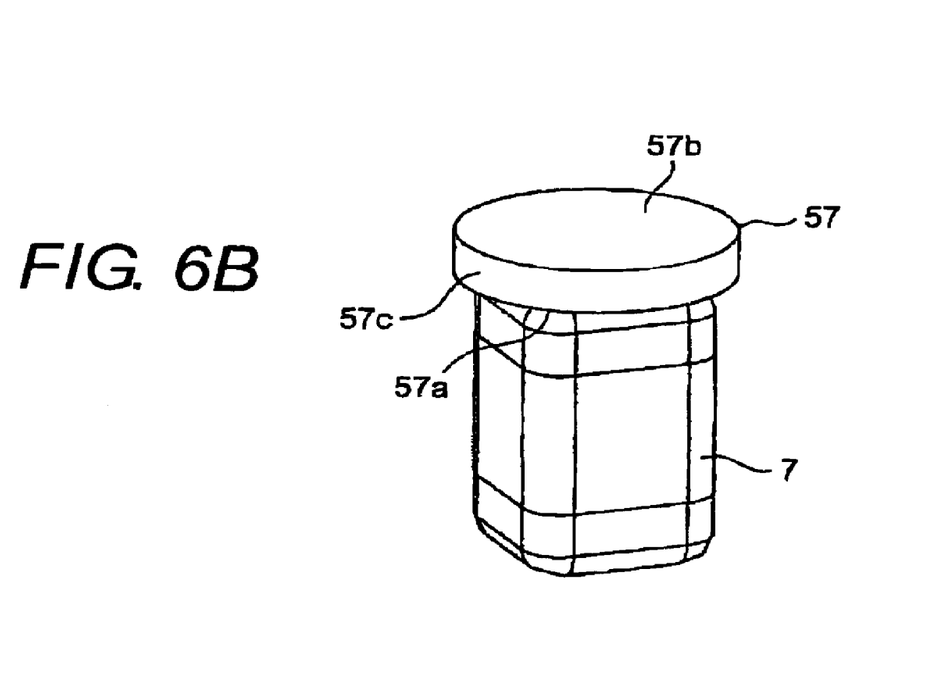
FIG. 6B shows an assembled inductor and the disk-shaped slab member.

From FIG. 5A to FIG. 5C show the inductor 7 and a slab member 33. The slab member 33 includes a fixing surface 33a, which faces and is fixed to one end 7g of the inductor 7 with conductive resin 34, and bonding surfaces 33b and 33c. As shown in FIG. 5B and FIG. 5C, the first electrode 5a of the laser diode 5 is connected to the slab member 33 with a bonding-wire, denoted by WIRE in figures. By using the slab member 33, the wire-bonding can be carried out independent of types of the inductor 7. FIG. 6A and FIG. 6B show another type of the slab member 57 that has a disk shape, which is also fixed to the inductor 7 with conductive resin 59.

Figure 7A:
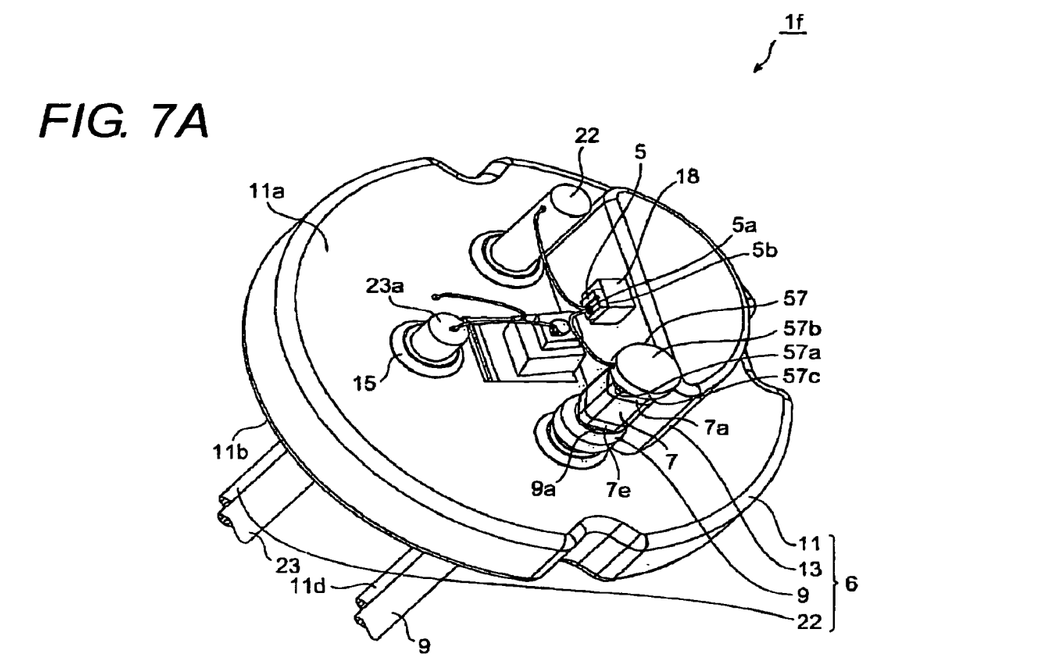
FIG. 7A is a perspective view showing the inductor and the disk-shaped slab member assembled to each other and fixed to the top surface of the lead.

As shown in FIG. 7A, the optical module 1f includes the slab member 57, the inductor 7 and the lead 9. The inductor 7 is mounted on the top surface 9a of the lead 9, while the slab member 57 is attached to the terminal 7a of the inductor 7. The laser diode 5 is connected to the side surface 57c of the slab member 57 with a bonding-wire. By using the disk-shaped slab member 57, the wire-bonding is independent not only on the types of the inductor 7 but also on the arrangement of the inductor, i.e., the angle of the rotation thereof.

The diameter of the disk-shaped slab member is about 1 mm, which is large enough compared to a diameter of the bonding-wire, typically 20 to 25 micron-meter. Accordingly the side of the slab member 57 may be regarded as a flat surface for the wire-bonding, which prevents the pull share strength of the bonding-wire from deteriorating.

On the other hand in a rectangular slab member, the rotation of the slab member must be taken into account. When the rotation of the slab member is out of the proper position, the wire-boding must by carried out on an inclined surface, which induces huge bending stress on a neck portion of the bonding-wire, thereby degrades mechanical strength of the bonding-wire. It is preferably within 5° between the side surface 13a of the block 13, where the laser diode is mounted thereon, and the side surface of the slab member. When this angle becomes larger than 10°, the wire-bonding itself can not be carried out.

Figure 7B:
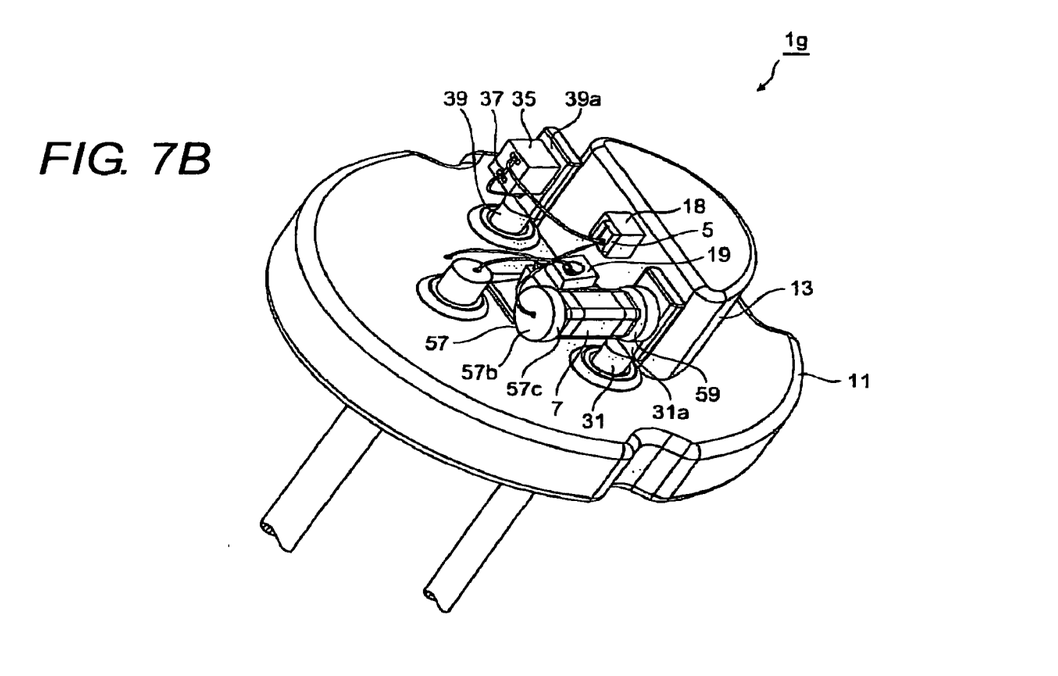
FIG. 7B is a perspective view of the inductor and the disk-shaped slab member assembled to each other and fixed to the side surface of the lead.

FIG. 7B shows another example 1g of the optical module 1g that provides the disk-shaped slab member 57 instead of the rectangular slab member shown in FIG. 5A. On the side surface 31a of the lead 31 is provided the disk-shaped slab member 59, while the anther disk-shaped slab member 57 is provided on the inductor 7, which is mounted on the former disk-shaped slab member 59. The laser diode 5 is wire-bonded to the side surface 57b of the disk-shaped slab member 57.

(Third Embodiment)

Figure 8:
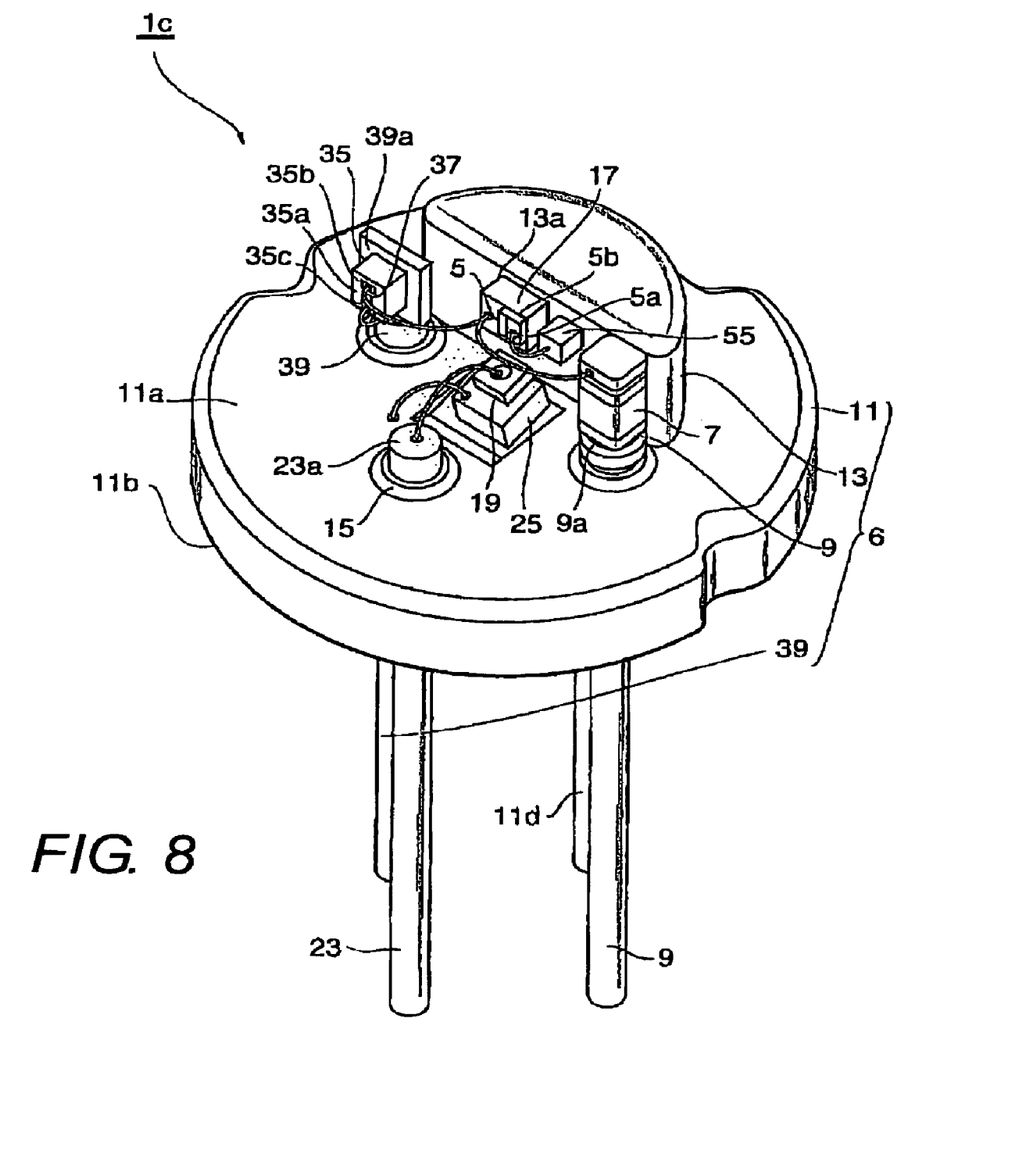
FIG. 8 is a perspective view showing an optical transmitting module according to the third embodiment of the invention.

FIG. 8 is a perspective view showing an optical transmitting module 1c according to the third embodiment of the invention.

The module 1c includes, further to the optical module 1b shown in FIG. 4, a conductive post 55 on the side surface 13a of the block 13, namely, on the immediate side of the laser diode 5. The post 55 is connected to the first electrode 5a of the laser diode with a bonding-wire. This configuration providing the post 55 may shorten the bonding-wire connecting the laser diode 5 to the block 13, thereby decreasing the parasitic inductance inherently accompanying with the thin and long conductive material.

The lead 9, the post 55, the laser diode 5, and the other lead 39 are arranged in an imaginary plane in this order. Accordingly, bonding-wires connecting these devices do not interfere with other bonding wires connecting the photodiode 19 to the lead 23 and that connecting the photodiode 19 to the base 11. Moreover, even in the imaginary plane, the bonding wire connecting the laser diode 5 to the electronic device 35 and that connecting the laser diode 5 to the inductor 7 do not interfere with respect each other.

(Fourth Embodiment)

Figure 9A:
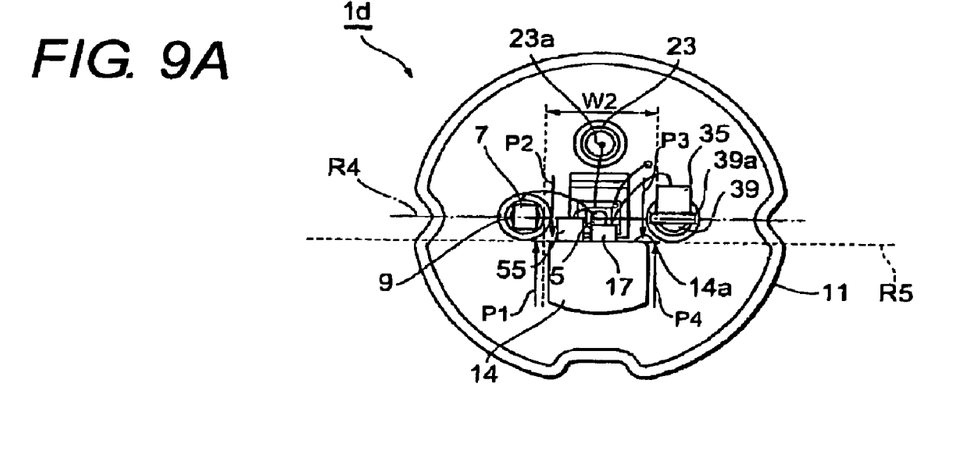
FIG. 9A is a plan view showing an optical transmitting module according to the fourth embodiment of the invention.
Figure 9B:
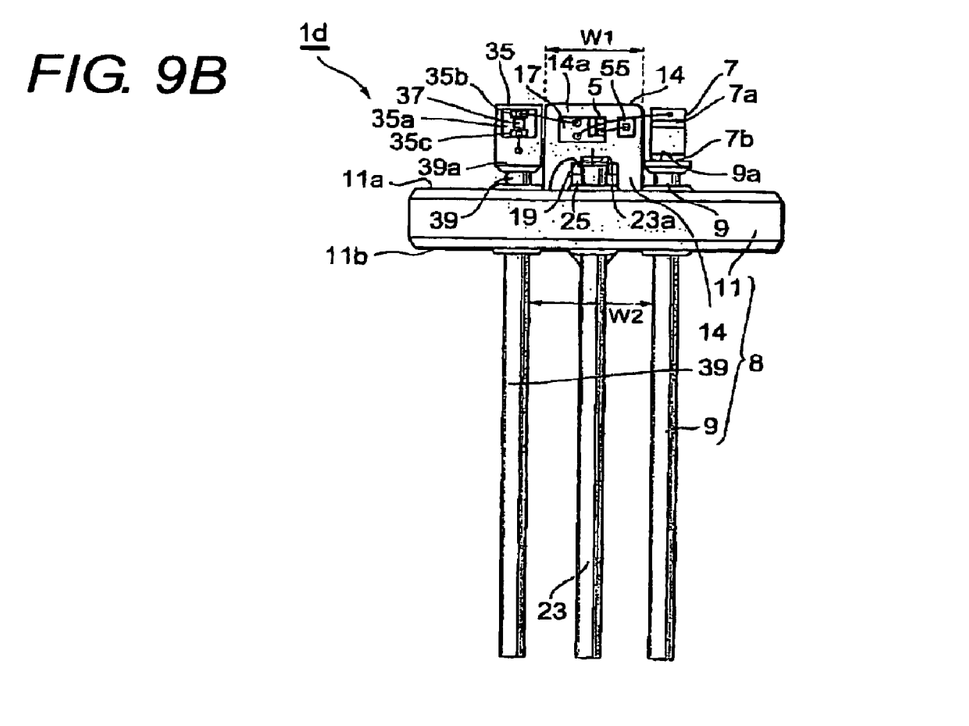
FIG. 9B is a side view showing the third embodiment of the invention.

FIG. 9A is a plan view showing a modification 1d of the third optical module 1c shown in FIG. 8, and FIG. 9B is a side view of the modified optical module 1d. In FIG. 9A and FIG. 9B, the width W1 of the block 14 is smaller than the span W2 of the leads 9 and 39, i.e., portions of the block 14 behind the leads 9 and 39 are cut. When the mechanical strength of the lead is not enough, the load applied thereto may deform the leads at the wire-bonding process. In such case, the leads must be supported from the behind, and the configuration shown in FIG. 11 enables to wire-bond in reliable.

(Fifth Embodiment)

Figure 10:
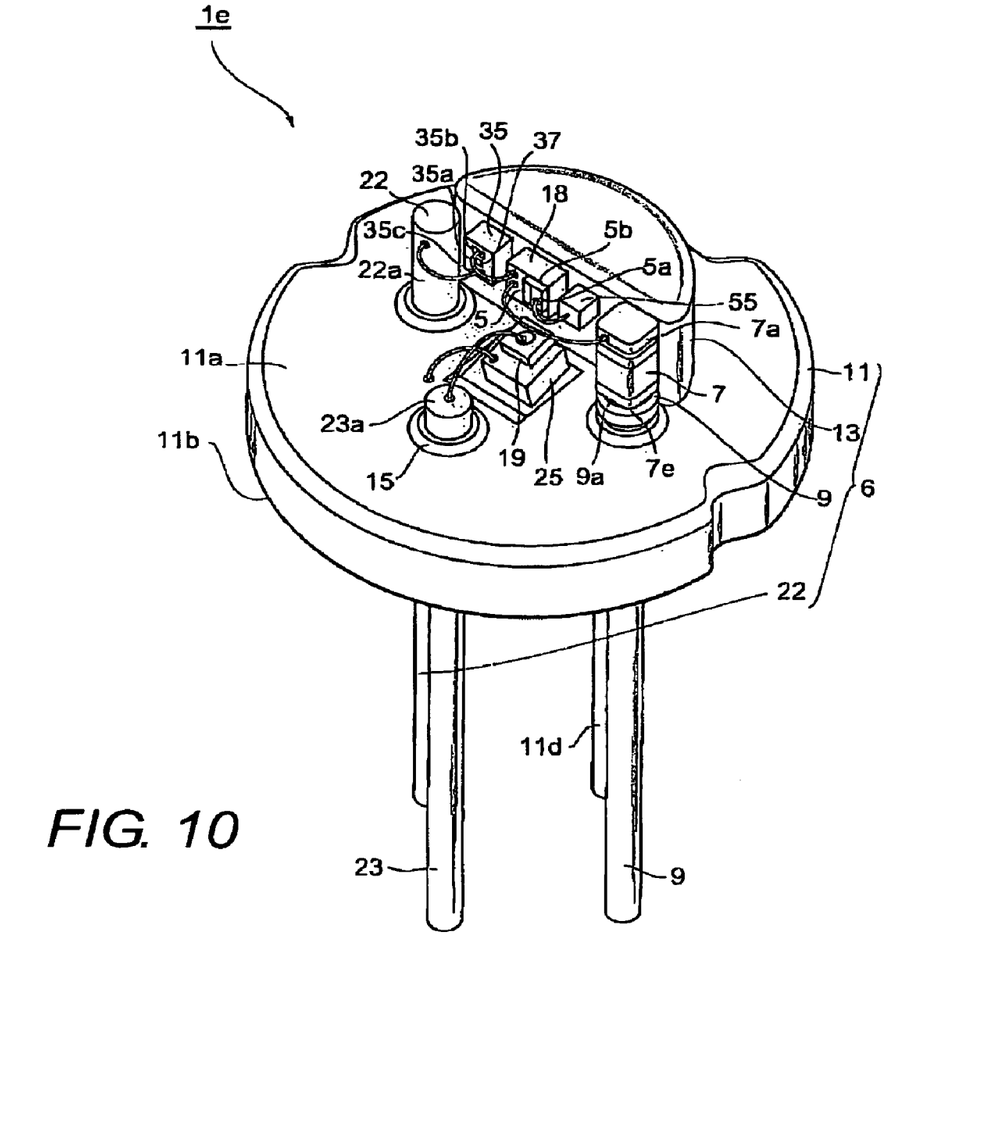
FIG. 10 is a perspective view showing an optical transmitting module according to the fifth embodiment of the invention.

FIG. 10 is a perspective view showing still another modification 1e of the present optical module. The modified optical module 1e includes, in addition to the optical module 1a according to the first embodiment shown in FIG. 1 and FIG. 2, the post 55 and the electronic device 35, both devices are mounted on the side surface 13a of the block 13 and sandwich the laser diode 5 therebeween.

Even in this configuration, bonding-wires, connecting these elements mounted on the side surface 13a and two leads 9 and 22, do not interfere with other bonding wires connecting the photodiode 19 to the lead 23 and to the base 11. Moreover, bonding-wires connecting devices mounted on the block 13 and those connecting devices on the block 13 to respective leads 9 and 22 also do not interfere with respect each other.

(Sixth Embodiment)

From FIG. 11 to FIG. 14 show a manufacturing process of the optical module of the present invention. Next, the manufacturing process of the module 1c will be described in detail.

Figure 11:
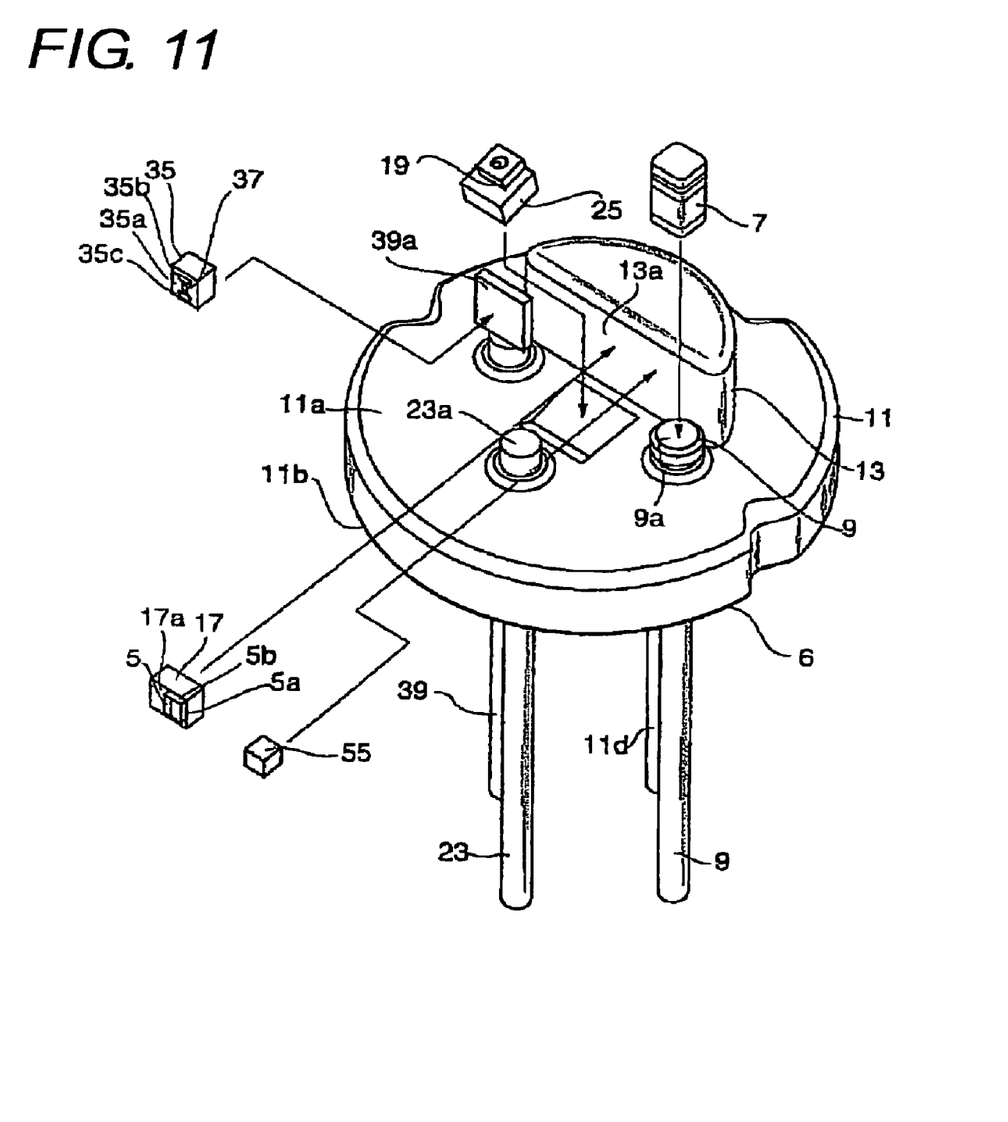
FIG. 11 shows a first step for manufacturing an optical transmitting module of the present invention.
Figure 12:
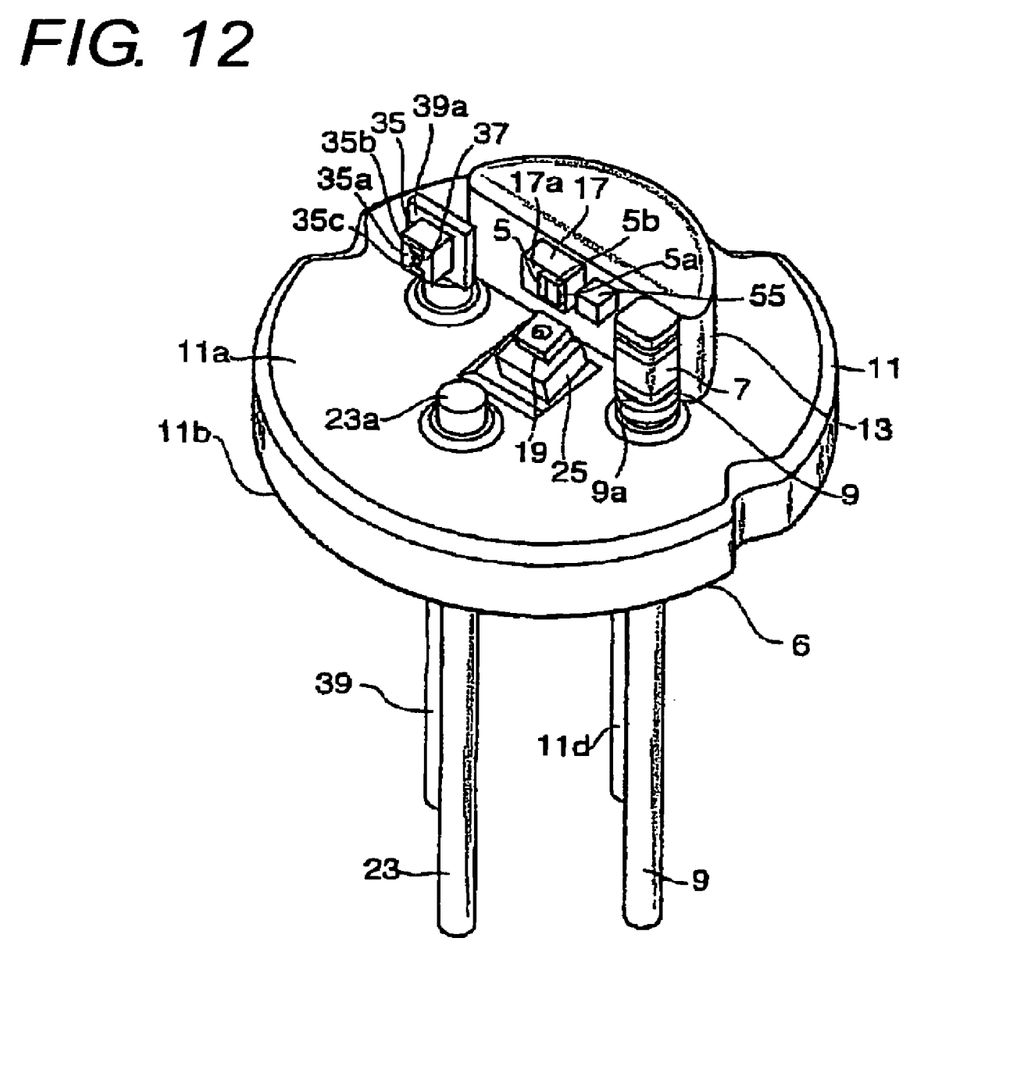
FIG. 12 shows a second step for manufacturing the optical transmitting module.

First, as shown in FIG. 11, optical and electrical devices, such as the stem 6, the laser diode 5, the inductor 7, the electronic device 35, the photodiode 19, and the post 55 are prepared and installed. The photodiode 19 is mounted on the base 11 via the sub-mount 25, the laser diode 5 is mounted on the side surface 13a of the block 13 via the heat sink 17, and the inductor 7 is installed on the end surface of the lead 9. The electronic device 35 is mounted on the flat end portion of the lead 11. The post is also mounted on the side 13a of the block 13.

Figure 13:
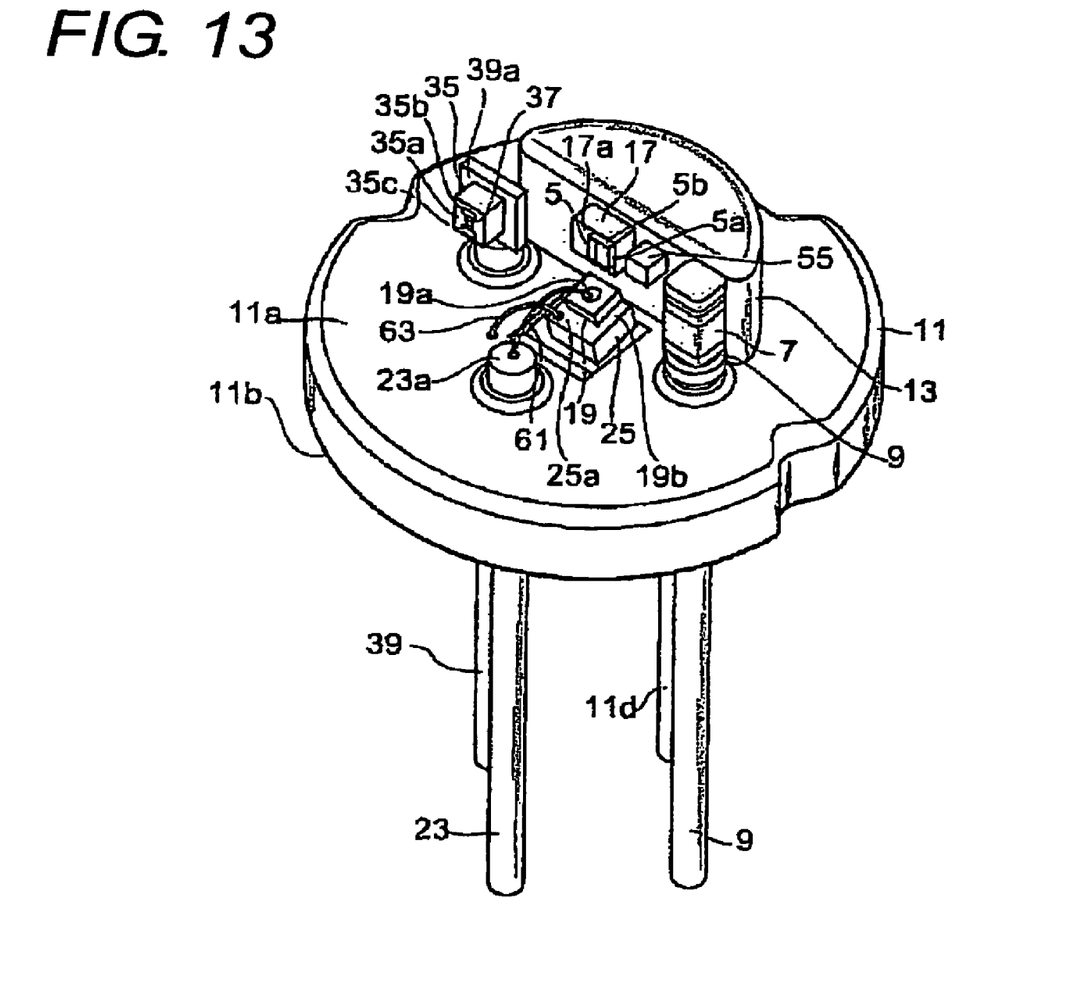
FIG. 13 shows a first wire-bonding step of the optical transmitting module.

Next, as shown in FIG. 13, the first wire-bonding process is carried out. That is, one electrode 19a of the photodiode 19 is wire-bonded to the tip 23a of the lead 23 with a bonding-wire 61, which extends in parallel to the base 11, and the metallic pattern 25a on the sub-mount 25 is wire-bonded to the base 11 with a bonding-wire 63. The order of the wire-bonding process is commutative. The other electrode 19b of the photodiode 19 is in contact with the metallic pattern 25a on the sub-mount25. The maximum levels of two bonding-wires 61 and 63 are preferably lower than the level of the laser diode 5 and that of the electronic device 35.

Figure 14:
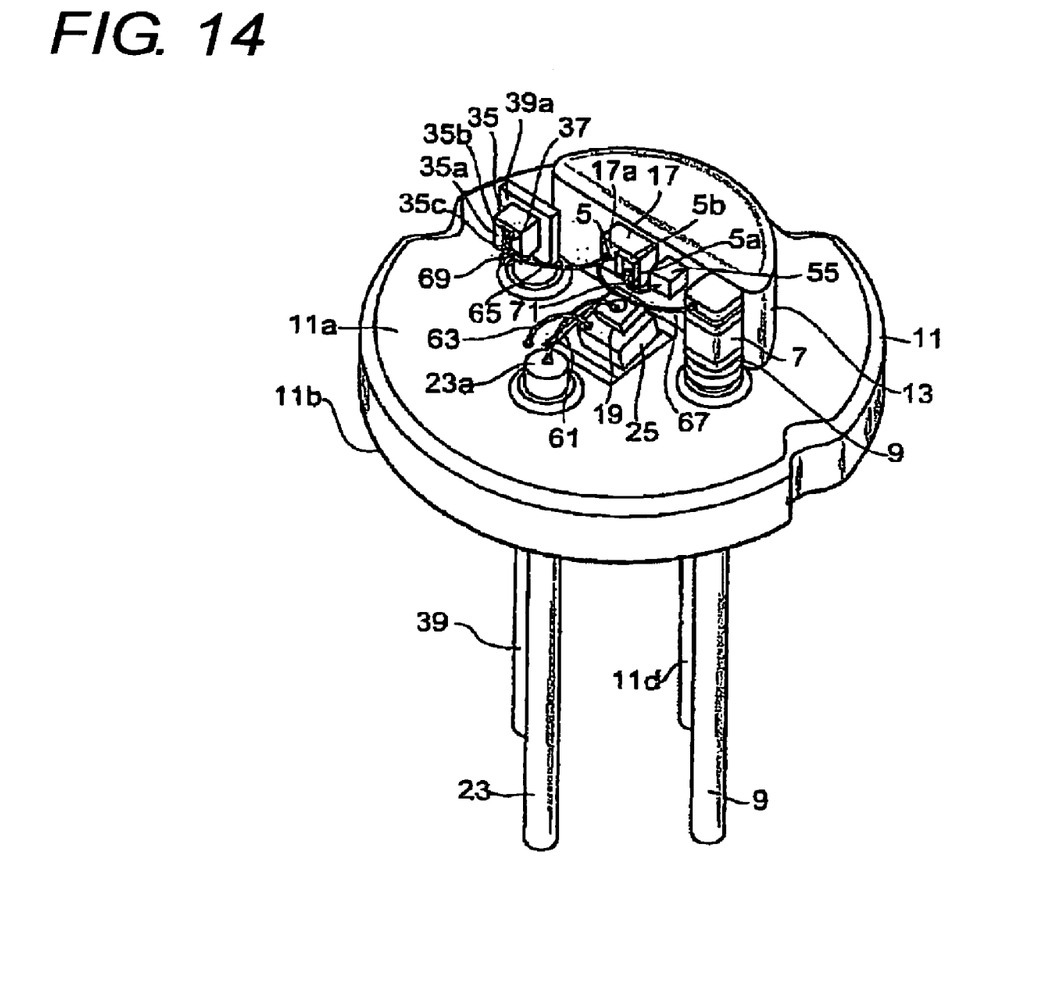
FIG. 14 shows a second wire-bonding step of the optical transmitting module.

Next, the second wire-bonding process is carried out around the laser diode 5, as shown in FIG. 14. One electrode 5a of the laser diode, an upper electrode thereof, is wire-bonded to the post 55 with a bonding-wire 71. The wiring pattern 17a on the heat sink 17 is wire-bonded to the first electrode 35b of the electronic device 35 with a bonding-wire 65, and to the first electrode 7a of the inductor 7 with a bonding-wire 67. The second electrode 5b of the laser diode 5 is connected to the wiring pattern 17a of the heat sink 17. The other electrode 35c of the electronic device 35 is connected to the side surface 39a of the lead 39 with a bonding-wire 69. Sequences of these wire-bonding may also be commutative.

In the embodiment described above, the first bonding-wire around the photodiode 19 and the second bonding-wire around the laser diode 5 are carried out in this order. However, the wire-boding above may be commutative.

Finally, after completing these wire-bonding processes, the cap 41 covers devices mounted on the base 11 by the resistance welding technique, which air-tightly seals the cavity formed by the base 11 and the cap 41, within which devices, the laser diode 5, the inductor 7, the electronic device 35, and the photodiode 19, are installed. The cap 41 may provide the lens 53 on the top center thereof, whereby the light emitted from the laser diode 5 may be output through the lens 63.

While the present invention has been described with reference to specific embodiments, the description is illustrative of the invention and is not to be construed as limiting the invention. Various modifications may occur to those skilled in the art without departing from the spirit and scope of the invention as defined by the appended claims.

What is claimed is:

1. An optical transmitting module, comprising:
    a semiconductor laser diode having a first electrode and a second electrode, said laser diode emitting light supplied with a driving signal and a bias current between said first and second electrodes;
    an inductor having a first terminal and a second terminal; and
    a CAN type package for enclosing said laser diode and said inductor, said CAN type package including
    a base,
    a block provided on said base and having a side surface for mounting said laser diode thereon, and
    first and second leads secured to said base, said first lead mounting said inductor thereon,
    wherein said first terminal of said inductor is connected to said first electrode of said laser diode and said second terminal of said inductor is connected to said first lead to supply said bias current to said first electrode of said laser diode, and wherein said second lead is coupled with said first electrode of said laser diode to supply said driving signal to said laser diode.

2. The optical transmitting module according to claim 1, wherein said first lead has a top surface to mount said inductor thereon.

3. The optical transmitting module according to claim 1, wherein said first lead has a flat side surface on a top portion thereof, to mount said inductor thereon.

4. The optical transmitting module according to claim 1, wherein said second lead has a flat side surface on a top portion thereof, and said transmitting module further includes a resistor mounted on said flat side surface of said second lead, said resistor having first and second terminals, said first terminal of said resistor being connected to said first electrode of said laser diode and said second terminal of said resistor being connected to said second lead to supply said driving signal to said first electrode of said laser diode via said resistor.

5. The optical transmitting module according to claim 1, further comprising a heat sink for mounting said laser diode thereon, said laser diode being mounted on said side surface of said block via said heat sink.

6. The optical transmitting module according to claim 5, wherein said heat sink is made of conductive material, said laser diode being mounted on said heat sink such that said second electrode of said laser diode faces and is in contact to said heat sink.

7. The optical transmitting module according to claim 5, wherein said heat sink is made of insulating material with a metallic pattern on a surface thereof, said laser diode being mounted on said heat sink such that said first electrode of said laser diode faces and is in contact to said metallic pattern provided on said surface of said heat sink.

8. The optical transmitting module according to claim 1, wherein said inductor further includes a slab member provided on said first terminal thereof, said slab member being made of conductive material and having a side surface and a top surface opposite to a surface facing and being in contact to said first terminal of said inductor.

9. The optical transmitting module according to claim 8, wherein said first electrode of said laser diode is connected to said top surface of said slab member.

10. The optical transmitting module according to claim 8, wherein said first electrode of said laser diode is connected to said side surface of said slab member.

11. The optical transmitting module according to claim 8, wherein said slab member is a disk-shaped member.

12. An transmitting optical sub-assembly, comprising:
an optical transmitting module, including:
a semiconductor laser diode having a first electrode and a second electrode, sad laser diode emitting light supplied with a driving signal and a bias current between said first and second electrodes,
a heat sink for mounting said laser diode thereon,
an inductor having a first terminal and a second terminal, and
a CAN type package including:
a base;
a block provided on said base and having a side surface for mounting said heat sink thereon, said laser diode being mounted on said side surface of said block via said heat sink;
first and second leads secured to said base; and
a cap for forming a cavity co-operated with said base, said laser diode and said inductor being enclosed within said cavity, said first lead mounting said inductor thereon such that said second terminal of said inductor faces and is in contact to said first lead and said first terminal of said inductor is connected to said first electrode of said laser diode supplying said bias current to said laser diode, said second lead being connected to said first electrode of said laser diode for supplying said driving signal;
a welding member cylindrically surrounding said cap of said CAN type package;
an alignment member having a bore and an end surface, said welding member being inserted into said bore and being fixed to said alignment member; and
a sleeve assembly, including:
a stub having a coupling fiber disposed in a center portion thereof, said light emitted from said laser diode being converged to said coupling fiber,
a sleeve for securing said stub to an end portion thereof,
a sleeve cover for covering said sleeve, said sleeve cover having an end surface, and
a bush press-fitted between said sleeve cover and said end portion of said sleeve such that said stub is tightly positioned within said sleeve,
wherein said sleeve assembly is optically aligned to said CAN type package by sliding said end surface of said sleeve cover on said end surface of said alignment member, and by sliding said welding member within said bore of said alignment member.

13. The transmitting optical sub-assembly according to claim 12, wherein said inductor is mounted on a top surface of said first lead.

14. The transmitting optical sub-assembly according to claim 12, wherein said first lead has a flat side surface on a top portion thereof, and said inductor is mounted on said flat side surface of said first lead.

15. The transmitting optical subassembly according to claim 12, wherein said optical transmitting module further includes a photodiode and a third lead secured to said base, said photodiode receiving said light emitted from said laser diode and outputting a current corresponding said light through said third lead.

* * * * *